United States Patent
Oonishi et al.

(10) Patent No.: US 6,768,953 B2
(45) Date of Patent: Jul. 27, 2004

(54) TEST APPARATUS

(75) Inventors: Fujio Oonishi, Yokohama (JP); Kenichi Shinbo, Yokohama (JP); Ritsuro Orihashi, Tokyo (JP); Masashi Fukuzaki, Honjyo (JP); Nobuo Motoki, Isezaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/269,380

(22) Filed: Oct. 10, 2002

(65) Prior Publication Data

US 2003/0040874 A1 Feb. 27, 2003

Related U.S. Application Data

(63) Continuation of application No. 10/159,146, filed on May 31, 2002, now Pat. No. 6,697,755.

(30) Foreign Application Priority Data

Jun. 28, 2001 (JP) .................................... 2001-165023

(51) Int. Cl.$^7$ ............................................. G01R 29/26
(52) U.S. Cl. ......................................... 702/69; 702/71
(58) Field of Search ............................ 702/69, 71, 72, 702/189–191, 108, 109, 123–125, 199; 714/814, 25, 37, 48, 700, 820

(56) References Cited

U.S. PATENT DOCUMENTS

| | | | | |
|---|---|---|---|---|
| 5,043,927 A | * | 8/1991 | Jackson | 702/66 |
| 5,422,896 A | * | 6/1995 | Shiratori et al. | 714/814 |
| 5,854,996 A | * | 12/1998 | Overhage et al. | 702/189 |
| 6,463,392 B1 | * | 10/2002 | Nygaard et al. | 702/89 |

* cited by examiner

*Primary Examiner*—Marc S. Hoff
*Assistant Examiner*—Craig Steven Miller
(74) *Attorney, Agent, or Firm*—Townsend and Townsend and Crew LLP

(57) ABSTRACT

In an odd side storage circuit, logical values of a decision subject signal HCMP are stored in first and second FFs respectively at decision edges LH and HL generated from odd-numbered edges of a decision edge EH. Logical values of a delayed decision subject signal HCMP' are stored in third and fourth FFs. According to a selection signal generated by a selection signal generation circuit based on outputs of the third and fourth FFs, a first selector selects an output of the first or second FF. An even side storage circuit operates similarly at even-numbered edges. A second selector selects the odd and even side storage circuits alternately. The FFs in the odd and even side storage circuits are reset by a decision edge LH' of the even side and the decision edge HL of the odd side, respectively.

7 Claims, 12 Drawing Sheets

FIG. 3

TRUTH TABLE OF SELECTION SIGNAL
GENERATION CIRCUIT 302

|   | a INPUT | b INPUT | y OUTPUT |
|---|---------|---------|----------|
| 1 | L | L | H |
| 2 | H | H | L |
| 3 | L | H | H |
| 4 | H | L | H |

RISE DECISION TIME OF RESPONSE SIGNAL

FALL DECISION TIME OF RESPONSE SIGNAL

DETECTION TIME OF L-TO-H CHANGE POINT IN RESPONSE SIGNA
- D-INPUT HCMP
- CK INPUT DECISION EDGE
- Q OUTPUT

DETECTION TIME OF H-TO-L CHANGE POINT IN RESPONSE SIGNAL
- D-INPUT HCMP
- CK INPUT DECISION EDGE
- Q OUTPUT

TEST APPARATUS

BACKGROUND OF THE INVENTION

The present invention relates to a test apparatus such as an LSI tester, and in particular to a test apparatus that stores a decision result of a level of a response signal from a device to be tested.

As the speed of devices to be tested such as LSIs becomes high, tests conducted in LSI testers become high in speed and accuracy. Therefore, it is necessary to apply a test signal to a device to be tested at high speed and effect a decision on a response signal from the device to be tested at high speed and at high accuracy. On the other hand, LSI testers are demanded to have reduced power consumption with due regard to environmental problems and have a larger number of pins in order to reduce the test cost. As a method for constructing a tester that satisfies these demands, it is promising to form the timing system in the tester of CMOS transistors.

FIG. 9 is a block diagram showing one configuration example of LSI testers. Reference numeral 1 denotes a logical value storage circuit, 2a and 2b analog comparators, 3 an LSI to be tested, 41 a timing generation circuit, 42 a pattern generation circuit, 43 a test signal signal generation circuit, 44 a driver, and 5 an expected value comparison circuit.

With reference to FIG. 9, the pattern generation circuit 42 generates predetermined waveform data for testing the LSI 3 to be tested serving as a device to be tested, and supplies the waveform data to the test waveform generation circuit 43. The test waveform generation circuit 43 generates a test waveform of the LSI 3 to be tested on the basis of the waveform data at timing of a waveform switchover edge (pulse) generated by the timing generation circuit 41, and supplies the test waveform to the LSI 3 to be tested via the driver 44. The waveform switchover edge has a period equivalent to a minimum period of the waveform data. In the LSI 3 to be tested, a predetermined test is conducted on the basis of the test waveform, and a response signal REP is output as a result of the test.

The response signal REP is supplied to the analog comparators 2a and 2b, and compared in level with predetermined thresholds ViH and ViL, respectively, therein. As shown in FIG. 10, the response signal REP is a signal that is 5 V at its H (High) level and 0 V at its L (Low) level. The thresholds ViH and ViL are set equal to, for example, 3 V and 1 V, respectively.

As shown in FIG. 10, the analog comparator 2a outputs a two-valued signal HCMP, which assumes the H level if the response signal REP is at least the threshold ViH and which assumes the L level otherwise. As shown in FIG. 10, the analog comparator 2b outputs a two-valued signal LCMP, which assumes the H level if the response signal REP is less than the threshold ViL and which assumes the L level otherwise. The two-valued signals HCMP and LCMP are supplied to the logical value storage circuit 1.

In the logical value storage circuit 1, logical values (H, L) of the two-valued signals HCMP and LCMP are detected at timing of decision edges (pulses) EH and EL generated by the timing generation circuit 41, and stored. As shown in FIG. 11, the logical value storage circuit 1 in the conventional art includes a D-type FF (flip-flop circuit) 1a for storing the logical value of the two-valued signal HCMP by using the decision edge EH for HCMP as a clock, and a D-type FF 1b for storing the logical value of the two-valued signal LCMP by using the decision edge EL for LCMP as a clock. The logical value of the two-valued signal HCMP is sampled at timing of the decision edge EH and stored in the FF 1a. The logical value of the two-valued signal LCMP is sampled at timing of the decision edge EL and stored in the FF 1b.

Each of the decision edges EH and EL is a pulse having a period equal to that of the waveform switchover edge supplied from the timing generation circuit 41 to the test waveform generation circuit 43. The decision edges EH and EL are supplied to the logical value storage circuit 1 with a delay after the waveform switchover edge. The delay is equal to a time length between the waveform switchover edge and supply of the two-valued signals HCMP and LCMP to the logical value storage circuit 1 conducted in response to the test waveform output from the test waveform generation circuit 43. The delay is, for example, 10 nsec. Furthermore, since the response signal REP has a rise characteristic and a fall characteristic as shown in FIG. 10, there is a time discrepancy between the rise timing of the two-valued signal HCMP and the fall timing of the two-valued signal LCMP, and there is a time discrepancy between the fall timing of the two-valued signal HCMP and the rise timing of the two-valued signal LCMP. According to the time discrepancy, deskewing for setting a phase relation between the decision edges EH and EL is conducted by using a delay circuit (not illustrated). Furthermore, the decision edge EH is deskewed so as to become in timing either the rise interval or the fall interval during which the level of the two-valued signal HCMP changes. In the same way, the decision edge EL is deskewed so as to become in timing either the fall interval or the rise interval during which the level of the two-valued signal LCMP changes.

Referring back to FIG. 9, logical values of the two-valued signals HCMP and LCMP stored in the logical value storage circuit 1 are supplied to the expected value comparison circuit 5, and compared with expected values supplied from the pattern generation circuit 42. A result of comparison indicating whether they are coincident with each other is obtained. On the basis of the comparison result, it is determined whether the LSI 3 to be tested is fail or pass as the test result of the LSI 3 to be tested. The expected values output from the pattern generation circuit 42 are based on the waveform data supplied from the pattern generation circuit 42 to the test waveform generation circuit 43. Generation timing of the expected values is delayed from the waveform data by a time length between generation of the waveform data and supply of logical values to the expected value comparison circuit 5.

SUMMARY OF THE INVENTION

If the logical value storage circuit 1 samples the two-valued signals HCMP and LCMP by using the FF 1a and 1b and stores the logical value as described above, the following problems occur.

As a first problem, there is a problem that a difference occurs in the rise characteristic and the fall characteristic of the two-valued signals HCMP and LCMP obtained by the processing of the analog comparators 2a and 2b and consequently an error occurs in the decision of the test result. This problem will now be described with reference to FIGS. 12A and 12B. Although the problem will be described with respect to the two-valued signal HCMP, a similar problem occurs in the two-valued signal LCMP as well.

As shown in FIGS. 12A and 12B, the two-valued signal HCMP input to the FF 1a rises steeply and falls gently. In other words, there is a difference between the rise time and the fall time (transition times) of the waveform. It is now supposed that the FF 1a has a threshold of Vth. When a level of the two-valued signal HCMP lower than the threshold Vth is sampled at the decision edge EH, the logical value of the L level is stored in the FF 1a. When a level of the two-valued signal HCMP that is equal to or higher than the threshold Vth is sampled at the decision edge EH, the logical value of the H level is stored in the FF 1a.

A rise interval of the two-valued HCMP is shown in FIG. 12A. It is supposed that the rise is started at t0. It is also supposed that the phase of the decision edge EH is gradually changed from an illustrated position (1) of the two-valued signal HCMP to an illustrated position (2) in a direction indicated by an arrow. When the phase of the decision edge EH arrives at timing when the two-valued signal HCMP becomes the level of the threshold Vth in the rise interval, the logical value of the H level is stored in the FF 1a. If a Q output of the FF 1a has been at the L level, then the Q output rises at the timing and becomes the H level. The phase of the decision edge EH at this time is delayed from the rise start time point t0 by Δt. This phase of the decision edge EH is timing determined by taking the delay of 10 nsec into consideration. In this way, the decision edge EH is deskewed.

A fall interval of the two-valued HCMP is shown in FIG. 12B. It is supposed that the fall is started at t0. If the decision edge EH is deskewed to timing delayed from the fall start time point t0 by the time length Δt in the same way as FIG. 12A, and the fall time of the two-valued HCMP is equal to its rise time as represented by a broken line, then the Q output of the FF 1a is changed from the H level to the L level at a time point (t0+Δt) when the two-valued signal HCMP becomes a level equal to the threshold Vth. As a matter of fact, however, the fall of the two-valued signal HCMP becomes gentler than the rise as represented by a solid line. At a time point delayed from the fall time point t0 by Δt and a time tdiff (>Δt), therefore, the level of the two-valued signal HCMP arrives at the threshold Vth. If the phase of the decision edge exists at the time point, the Q output of the FF 1a is changed from the H level to the L level at the time point.

Even if the sample timing of the two-valued signal HCMP caused by the decision edge EH exists in the rise time of the two-valued signal HCMP at a certain time point, the sample timing might in the fall time at another time point. If the phase of the decision edge EH is deskewed so as to become a time point (t0+Δt described above) delayed from the start time point of each of the rise time and the fall time of the two-valued signal HCMP by a fixed time, then a false logical value is stored in the FF 1a for the above described reason.

A second problem of the conventional logical value storage circuit 1 will now be described. If CMOS FFs (flip-flop circuits) are used as the FF 1a and FF 1b included in the logical value storage circuit 1, there occurs a difference in stored logical values because of a set up time difference between the FF 1a and FF 1b. And the time difference becomes an error caused at the time of storage. This is the second problem. This will now be described with reference to FIGS. 13A and 13B. In order to make the second problem clear, it is now supposed that the rise time of the two-valued signal HCMP is equal to the fall time thereof.

First, the rise of the two-valued signal HCMP will now be described. With reference to FIG. 13A, it is supposed that the phase of the decision edge EH is gradually changed from an illustrated position (1) of the two-valued signal HCMP to an illustrated position (2) in a direction indicated by an arrow. When the phase of the decision edge EH arrives at a time point t0 when the level of the two-valued signal HCMP becomes the threshold Vth of the FF 1a, the Q output of the FF 1a is changed from the L level to the H level.

The fall of the two-valued signal HCMP will now be described. With reference to FIG. 13B, it is supposed that the phase of the decision edge EH is gradually changed from an illustrated position (1) of the two-valued signal HCMP to an illustrated position (2) in a direction indicated by an arrow. Even if the phase of decision edge EH exists at a time point t0 when the level of the two-valued signal HCMP becomes the threshold Vth of the FF 1a, the Q output of the FF 1a is not changed from the H level to the L level. The Q output of the FF 1a is inverted in level only when the phase is delayed from t0 by tdiff.

Even if the rise characteristic of the two-valued signal HCMP is the same as the fall characteristic thereof, the phase of the decision edge EH measured from the time point t0 when the level inversion of the Q output is caused in the rise differs from that in the fall. (The difference is referred to as set up time difference.) As a result, an error is caused in a result of the logical decision. For example, in the case of the decision edge EH deskewed to the rise of the two-valued signal HCMP, a false decision is effected in the fall, even if the level (logical value) is judged correctly in the rise of the two-valued signal.

The second problem is such a set up time difference of the FF. Herein, however, the phenomenon that a logical value stored in the FF differs according to the immediately preceding stored value is referred to as set up time difference of FF.

An object of the present invention is to provide a high accuracy test apparatus capable of solving such problems and preventing an error from being caused in stored logical values by a difference between the rise characteristic and fall characteristic of a two-valued signal obtained from an analog comparator and the set up time difference of FF.

In order to achieve the object, in accordance with a first aspect of the present invention, a test apparatus includes, a comparator for comparing a response signal supplied from a device to be tested in response to a test waveform with a predetermined threshold and outputting a two-valued decision subject signal depending on a level of the response signal, timing generation means for generating a decision edge at predetermined timing for the decision subject signal, logical value storage means for extracting and storing logical values of the decision subject signal based on the decision edge, and comparison means for comparing an output of the logical value storage means with an expected value and determining whether the device to be tested should fail or pass. In the test apparatus, the logical value storage means includes first delay means for delaying the decision edge generated by the timing generation means by a predetermined time and generating a first decision edge, second delay means for delaying the decision edge generated by the timing generation means by a predetermined time and generating a second decision edge, the second decision edge being adjusted in timing with respect to the first decision edge according to a fall time of the decision subject signal, first storage means for storing a logical value of the decision subject signal obtained at timing of the first decision edge, second storage means for storing a logical value of the decision subject signal obtained at timing of the second decision edge, and selection means for selecting either the logical value stored in the first storage means or the logical value stored in the second storage means and supplying the selected logical value to the comparison means. When the first decision edge is in or near a fall time of the decision subject signal, the selection means selects the logical value stored in the second storage means.

In accordance with a second aspect of the present invention, in the test apparatus according to the first aspect of the present invention, the logical value storage means further includes third delay means for delaying the input decision subject signal by a predetermined time to generate a delayed decision subject signal, third storage means for storing a logical value of the delayed decision subject signal obtained at timing of the first decision edge, fourth storage means for storing a logical value of the delayed decision subject signal obtained at timing of the second decision edge, and means for controlling selection operation of the selection means based on a relation between the logical values stored in the third and fourth storage means.

In accordance with a third aspect of the present invention, a test apparatus includes a comparator for comparing a response signal supplied from a device to be tested in response to a test waveform with a predetermined threshold and outputting a two-valued decision subject signal depending on a level of the response signal, timing generation means for generating a decision edge at predetermined timing for the decision subject signal, first logical value storage means for extracting and storing logical values of the decision subject signal based on every other edge of the decision edge, second logical value storage means for extracting and storing logical values of the decision subject signal based on every other edge of the decision edge different from that for the first logical value storage means, first selection means for selecting the logical value stored in the first logical value storage means when the decision edge is supplied to the first logical value storage means and selecting the logical value stored in the second logical value storage means when the decision edge is supplied to the second logical value storage means, and comparison means for comparing an output of the first logical value storage means with an expected value and determining whether the device to be tested should fail or pass. Each of the first and second logical value storage means includes first delay means for delaying the decision edge generated by the timing generation means by a predetermined time and generating a first decision edge, second delay means for delaying the decision edge generated by the timing generation means by a predetermined time and generating a second decision edge, the second decision edge being adjusted in timing with respect to the first decision edge according to a fall time of the decision subject signal, first storage means for storing a logical value of the decision subject signal obtained at timing of the first decision edge, second storage means for storing a logical value of the decision subject signal obtained at timing of the second decision edge, second selection means for selecting either the logical value stored in the first storage means or the logical value stored in the second storage means and supplying the selected logical value to the first selection means, and reset means for resetting the first and second storage means at least before newly storing logical values of the decision subject signal at the first and second decision edges. When the first decision edge is in or near a fall time of the decision subject signal, the second selection means selects the logical value stored in the second storage means.

In accordance with a fourth aspect of the present invention, in the test apparatus according to the third aspect of the present invention, each of the first and second logical value storage means further includes third delay means for delaying the input decision subject signal by a predetermined time to generate a delayed decision subject signal, third storage means for storing a logical value of the delayed decision subject signal obtained at timing of the first decision edge; fourth storage means for storing a logical value of the delayed decision subject signal obtained at timing of the second decision edge, and means for controlling selection operation of the second selection means based on a relation between the logical values stored in the third and fourth storage means. The third and fourth storage means are also reset by the reset means at least before newly storing logical values of the delayed decision subject signal at the first and second decision edges.

In accordance with a fifth aspect of the present invention, in the test apparatus according to the fourth aspect of the present invention, the reset means resets the first to fourth storage means of the first logical value storage means at timing of the first decision edge in the second logical value storage means, and the reset means resets the first to fourth storage means of the second logical value storage means at timing of the second decision edge in the first logical value storage means.

In accordance with a sixth aspect of the present invention, a test apparatus includes a comparator for comparing a response signal supplied from a device to be tested in response to a test waveform with a predetermined threshold and outputting a two-valued decision subject signal depending on a level of the response signal, timing generation means for generating a decision edge at predetermined timing for the decision subject signal, logical value storage means for extracting and storing logical values of the decision subject signal based on the decision edge, and comparison means for comparing an output of the logical value storage means with an expected value and determining whether the device to be tested should fail or pass. The logical value storage means includes first delay means for delaying the decision edge generated by the timing generation means by a predetermined time and generating a first decision edge, second delay means for delaying the decision edge generated by the timing generation means by a predetermined time and generating a second decision edge, the second decision edge being adjusted in timing with respect to the first decision edge according to a fall time of the decision subject signal, first storage means for storing a logical value of the decision subject signal obtained at timing of the first decision edge, second storage means for storing a logical value of the decision subject signal obtained at timing of the second decision edge, and selection means for selecting either the logical value stored in the first storage means or the logical value stored in the second storage means and supplying the selected logical value to the comparison means, third storage means to which the logical value stored in the first storage means is transferred, fourth storage means to which the logical value stored in the second storage means is transferred, selection means for selecting either the logical value stored in the third storage means or the logical value stored in the fourth storage means, and supplying the selected logical value to the comparison means, and reset means for resetting the first and second storage means after the logical values have been transferred therefrom to the third and fourth storage means. When the first decision edge is in or near a fall time of the decision subject signal, the selection means selects the logical value stored in the fourth storage means.

In accordance with a seventh aspect of the present invention, in the test apparatus according to the sixth aspect of the present invention, the logical value storage means further includes third delay means for delaying the input decision subject signal by a predetermined time to generate a delayed decision subject signal, fifth storage means for storing a logical value of the delayed decision subject signal obtained at timing of the first decision edge, sixth storage means for storing a logical value of the delayed decision subject signal obtained at timing of the second decision edge, and seventh storage means to which the logical value stored in the fifth storage means is transferred, eighth storage means to which the logical value stored in the sixth storage means is transferred, and means for controlling selection operation of the selection means based on a relation between the logical values stored in the seventh and eighth storage means. The fifth and sixth storage means are also reset by the reset means after the logical values stored therein have been transferred to the seventh and eighth storage means.

Other objects, features and advantages of the invention will become apparent from the following description of the embodiments of the invention taken in conjunction with the accompanying drawings.

BRIEF DESCRIPTION OF THE DRAWINGS

FIG. 3 is a diagram showing a concrete example of a truth table of a selection signal generation circuit shown in FIG. 1;

DESCRIPTION OF THE EMBODIMENTS

Hereafter, embodiments of the present invention will be described with reference to the drawings.

Figure 1:
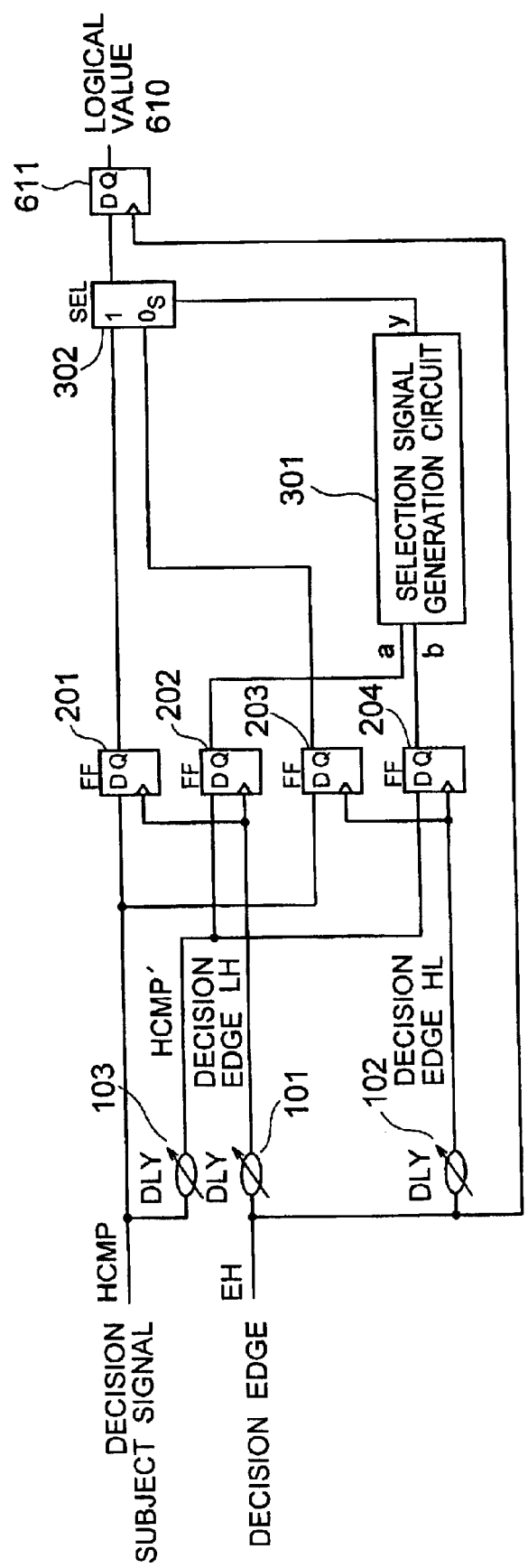
FIG. 1 is a block diagram showing a logical value storage circuit in a first embodiment of a test apparatus according to the present invention.

FIG. 1 is a block diagram showing a first embodiment of a logical value storage circuit in a test apparatus according to the present invention. Reference numerals 101 to 103 denote delay circuits, 201 to 204 D-type FFs (flip-flop circuits), 301 a selection signal generation circuit, 302 a selector, and 611 a D-type FF.

Figure 9:
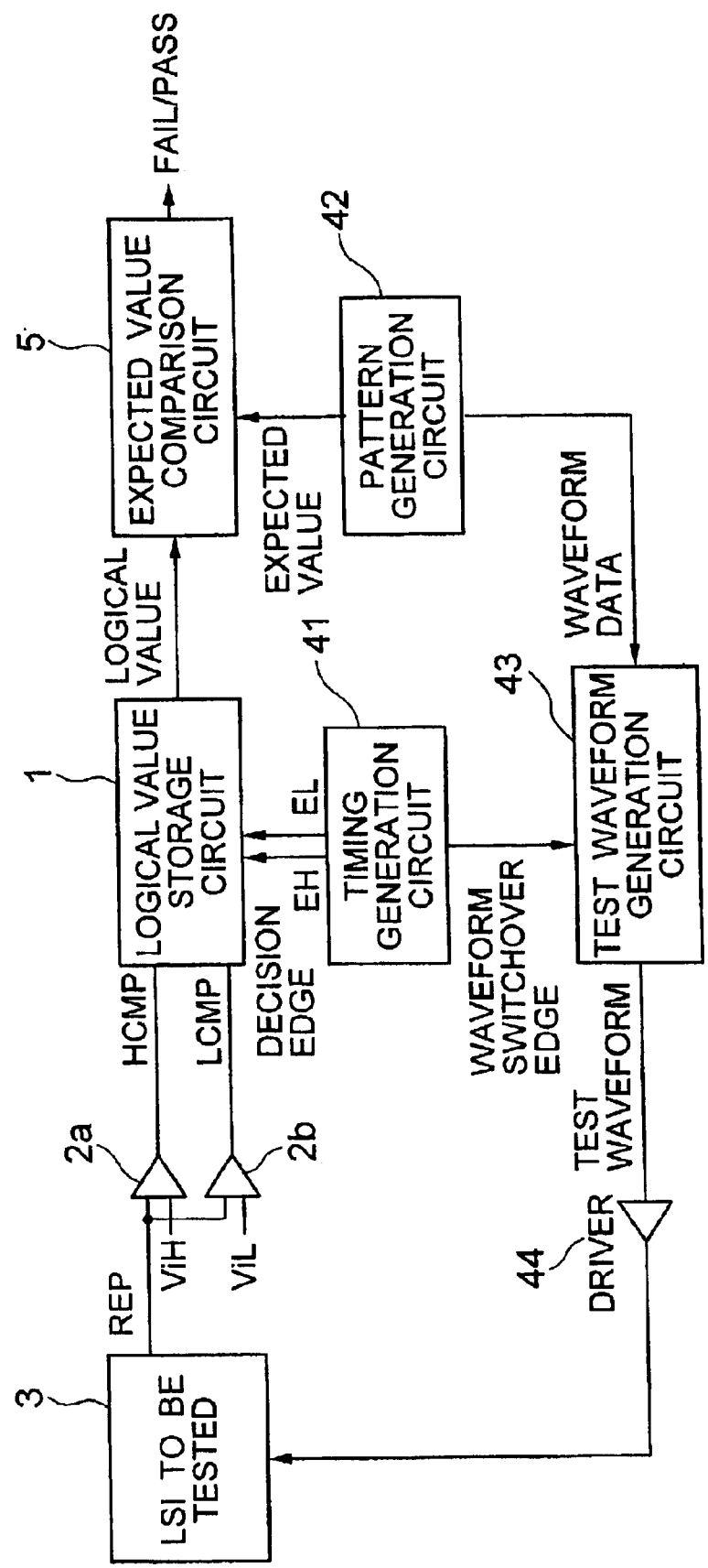
FIG. 9 is a block diagram showing a configuration example of a test apparatus.
Figure 10:
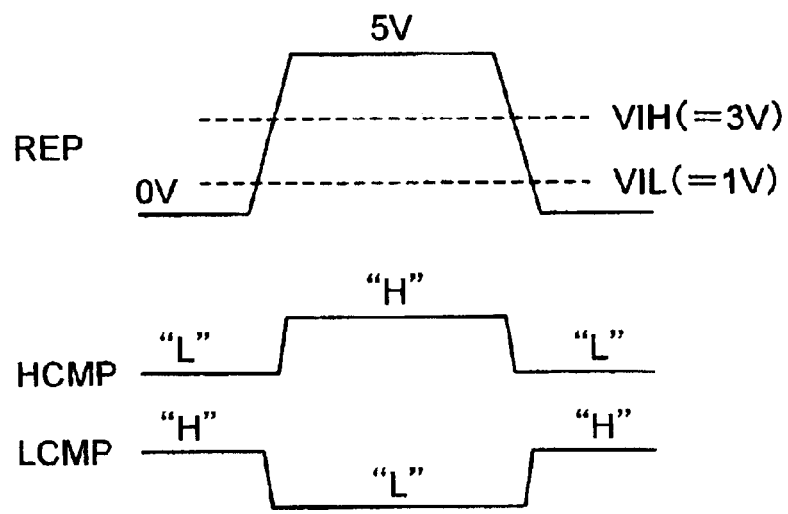
FIG. 10 is a diagram showing an operation example of an analog comparator shown in FIG. 9.

The first embodiment solves the first problem in the test apparatus having a configuration shown in FIG. 9.

Figure 2:
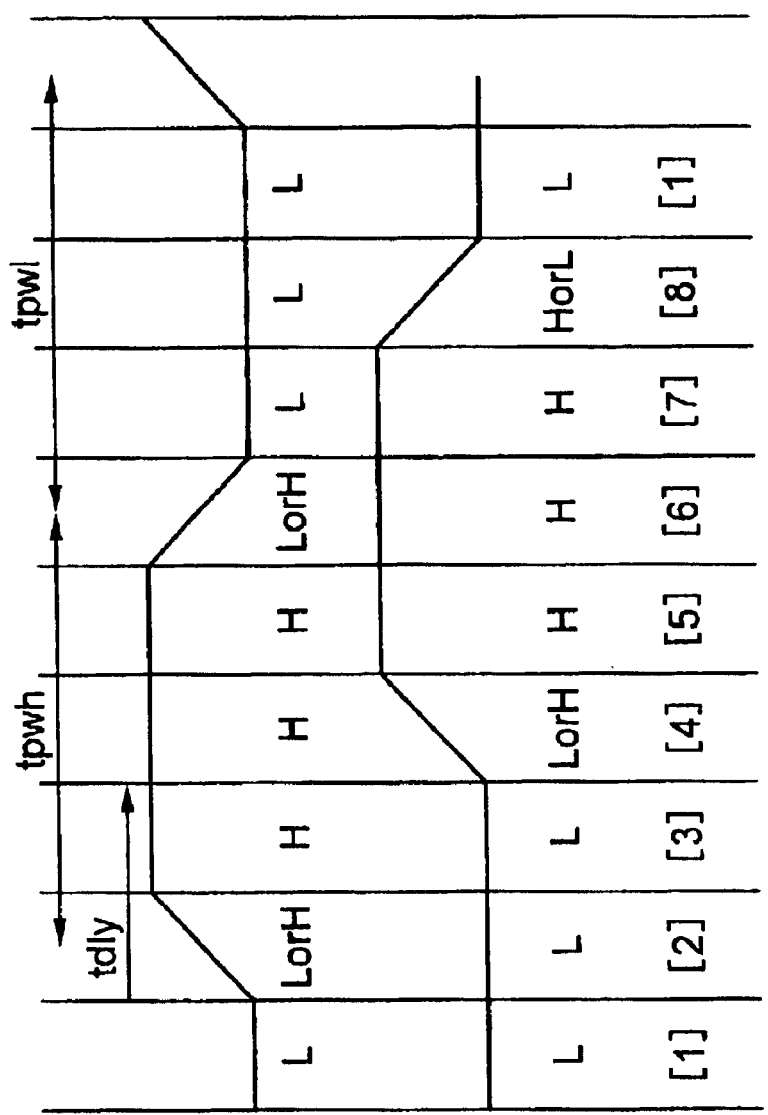
FIG. 2 is a timing chart showing an operation of the embodiment shown in FIG. 1.
Figure 4:
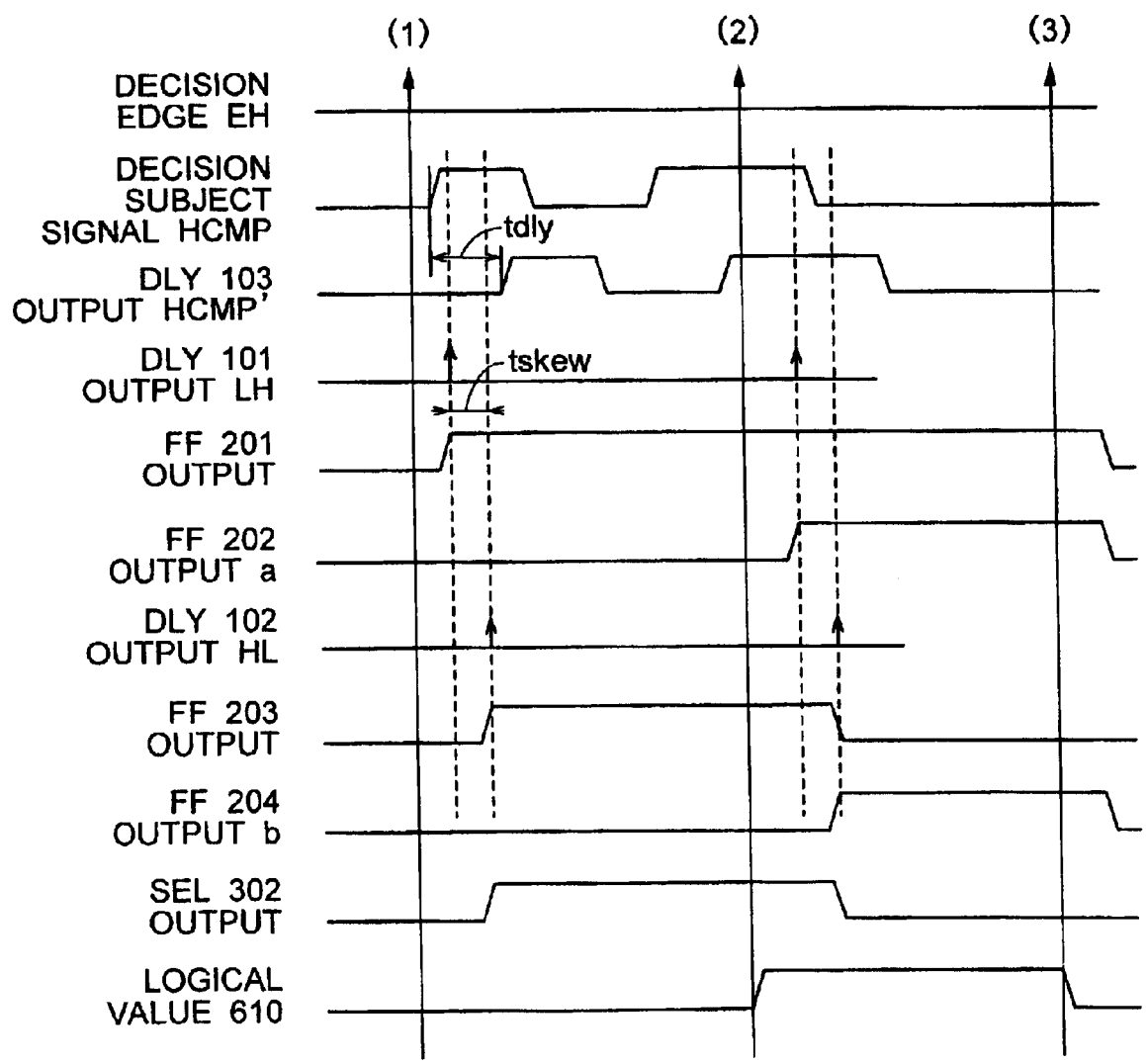
FIG. 4 is a timing chart showing signals in various locations in FIG. 1.

FIG. 2 is a timing chart showing an operation of the embodiment shown in FIG. 1. FIG. 3 is a truth table prescribing a concrete example of a selection operation in a selection signal generation circuit shown in FIG. 1. FIG. 4 is a waveform diagram showing timing relations among signals in various locations in FIG. 1.

Figure 11:
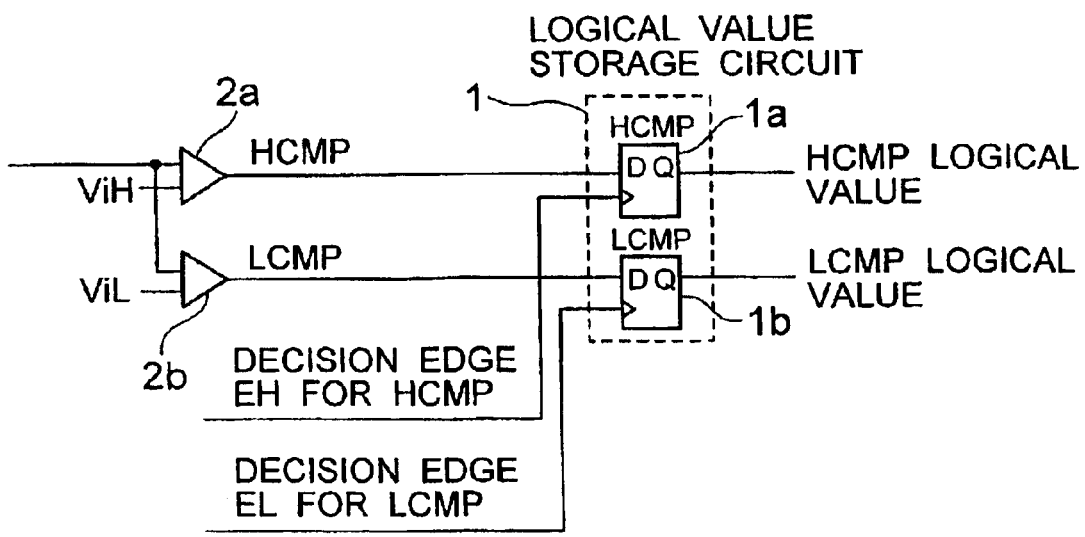
FIG. 11 is a block diagram showing a conventional art example of a logical value storage circuit shown in FIG. 9.

A configuration section shown in FIG. 1 is a section supplied with the two-valued signal HCMP from the analog comparator 2a shown in FIGS. 9 and 11 and supplied with the decision edge EH from the timing generation circuit shown in FIGS. 9 and 11.

The decision subject signal HCMP is supplied to D inputs of the FFs 201 and 203. In addition, the decision subject signal HCMP is delayed by the delay circuit 103, and then supplied to D inputs of the FFs 202 and 204 as a delayed decision subject signal HCMP'. The decision edge EH is delayed by the delay circuit 101, and then supplied to clock inputs of of the FFs 201 and 202 as a decision edge LH. In addition, the decision edge EH is delayed by the delay circuit 102, and then supplied to clock inputs of of the FFs 203 and 204 as a decision edge HL.

FIG. 2 shows a concrete example of timing relations between the D inputs of the FFs 201 and 203 and the D inputs of the FFs 202 and 204. It is now supposed that the D inputs of the FFs 202 and 204 are delayed from the D inputs of the FFs 201 and 203 by a delay time tdly, which is equal to ¼ of a minimum repetition period of the decision subject signal HCMP. The time delay is set by the delay circuit 103. The delay circuit 101 functions to deskew the decision edge EH to a predetermined rise time of the decision subject signal HCMP. The delay circuit 102 functions to deskew the decision edge EH to a predetermined fall time of the decision subject signal HCMP in order to solve the first problem. As a result, the decision edge LH is deskewed to the predetermined rise time of the decision subject signal HCMP, and the decision edge HL is deskewed to the predetermined fall time of the decision subject signal HCMP.

In FIG. 2, time tpwh denotes a minimum pulse width of the H level of the decision subject signal HCMP, and time tpwl denotes a minimum pulse width of the L level of the decision subject signal HCMP. It is supposed that the delay time tdly is shorter than each of the pulse widths tpwh and tpwl.

As shown in FIG. 2, a minimum repetition period of the decision subject signal HCMP is divided into eight equal time zones. The time zones are denoted by [1], [2], [3], [4], [5], [6], [7] and [8], respectively. Logical values stored in the FFs 201 and 202 when the decision edge LH is in each time zone are shown in FIG. 2. When the decision edge LH is in the time zone [1], the L level is stored in the FFs 201 and 202. When the decision edge LH is in the time zone [2], the L or H level is stored in the FF 201 and the L level is stored in the FF 202. When the decision edge LH is in the time zone [3], the H level is stored in the FF 201 and the L level is stored in the FF 202. . . . When the decision edge LH is in the time zone [7], the L level is stored in the FF 201 and the H level is stored in the FF 202. When the decision edge LH is in the time zone [8], the L level is stored in the FF 201 and the H or L level is stored in the FF 202.

This is true of the FFs 203 and 204 as well. The decision edge HL used for the FFs 203 and 204 is different in phase from the decision edge LH used for the FFs 201 and 202. Furthermore, the D inputs of the FFs 203 and 204 are the same as the D inputs of the FFs 201 and 202. Therefore, a change of logical value of the decision subject signal HCMP stored in each of the FFs 203 and 204 in the time zones [1], [2], [3], [4], [5], [6], [7] and [8] have a discrepancy corresponding to the phase difference as compared with a change of logical value stored in each of the FFs 201 and 202.

A logical value of the decision subject signal HCMP is stored in the FF 201 at timing of the decision edge LH, whereas a logical value of the same decision subject signal HCMP is stored in the FF 203 at timing of the decision edge HL. The selector 302 functions to select either the logical value stored in the FF 201 or the logical value stored in the FF 203. The selection is controlled by a selection signal y, which is generated by the selection signal generation circuit 301 on the basis of logical values (outputs) "a" and "b" respectively stored in the FFs 202 and 204.

Figure 12A:
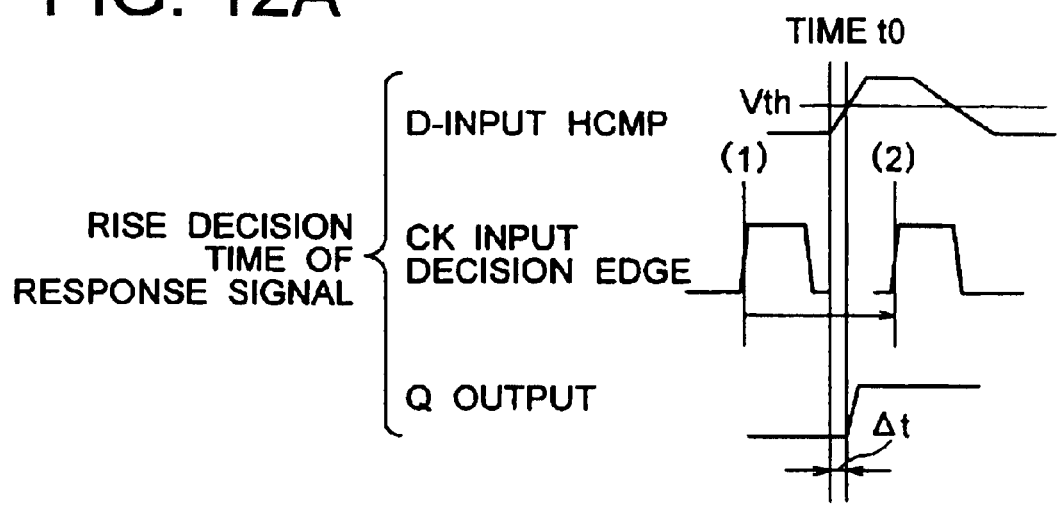
FIGS. 12A and 12B are diagrams showing a first problem of the conventional art example shown in FIG. 9.
Figure 12B:
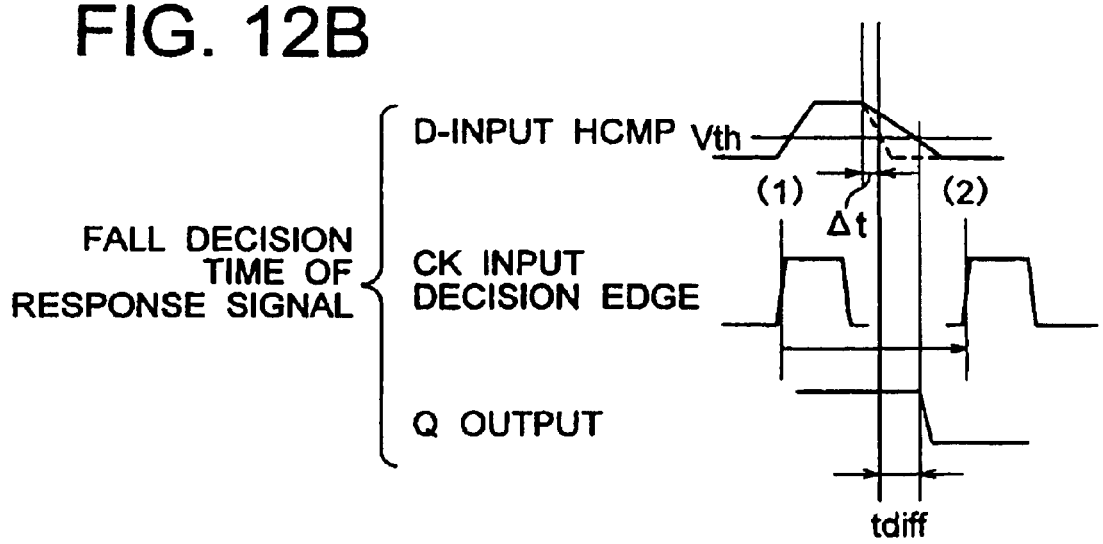

The selection operation conducted in the selector 302 by the selection signal generation circuit 301 will now be described. In short, when the decision edge LH exists at or near fall time of the decision subject signal HCMP, the selector 302 conducts the selection operation so as to use the level of the decision subject signal HCMP taken in at the timing of the decision edge HL, which is delayed in time than the decision edge LH, as the logical value. In other words, at such time, the selector 302 selects the logical value stored in the FF 203, and thereby the first problem caused by the fall characteristic of the decision subject signal HCMP described with reference to FIG. 12B is solved.

In other words, a logical value of the decision subject signal HCMP that precedes the logical value of the decision subject signal HCMP stored in the FF 201 by the delay time tdly is stored in the FF 202. Furthermore, a logical value of the decision subject signal HCMP that precedes the logical value of the decision subject signal HCMP stored in the FF 203 by the delay time tdly is stored in the FF 204.

In addition, the logical values stored in the FFs 201 and 203 and the logical values stored in the FFs 202 and 204 are logical values of the decision subject signal CMP at timing of the decision edge LH and logical values of the decision subject signal CMP at timing of the decision edge HL delayed from the decision edge LH by time tskew, respectively. As for the time difference tskew, its concrete example will be described later. The time difference tskew is shorter than the delay time tdly of the delay circuit 103.

It is now supposed that the timing of the decision edge LH is in the time zone [2]. In the FF 201, a logical value of the rise of the decision subject signal HCMP is stored. In the FF 202, however, the level of the decision subject signal HCMP that precedes the rise by the delay time tdly, i.e., a logical value of the L level is stored by using the delayed decision subject signal HCMP'. Since the decision edge HL is delayed from the decision edge LH by the time difference tskew, the H level that is later than the rise of the decision subject signal HCMP is stored in the FF 203 as a logic value. However, a logical value stored in the FF 204 is a level of the delayed decision subject signal HCMP' supplied from the delay circuit 103 in either time zone [2] or [3] shown in FIG. 2, i.e., always the L level.

In this way, when the decision edge LH is in the time zone [2], both the logical value stored in the FF 202 and the logical value stored in the FF 204 are L levels. In this case, the logical value stored in the FF 201 becomes the logical value of the rise of the decision subject signal HCMP. If the decision edge EH generated by the timing generation circuit 41 (FIG. 9) is deskewed to this rise, then the logical value of this rise must be extracted. In this case, therefore, the selection signal generation circuit 301 must generate the selection signal y so as to make the selector 302 select the logical value stored in the FF 201. It is now supposed that the selector 302 selects the logical value stored in the FF 201 when the selection signal is the H level and selects the logical value stored in the FF 203 when the selection signal is the L level. When both logical values "a" and "b" respectively stored in the FFs 202 and 204 are in this case, the selection signal generation circuit 301 causes the selection signal y to become the H level.

When the decision edge LH is in the time zone [6] shown in FIG. 2, a level of the decision subject signal HCMP at its fall time is stored in the FF 201 as a logical value. In order to solve the first problem, the logical value stored in the FF 201 is not selected at this time, and the selector 302 selects the logical value stored in the FF 203.

At this time, a level of the decision subject signal HCMP delayed by the delay circuit 103 in the time zone [6], i.e., the logical value of the H level is stored in the FF 202. The phase relation of the decision edge HL to the decision edge LH, i.e., the time difference tskew is set, for example, so as to cause the decision edge HL to be in an interval between a time point (t0+Δt) and (t0+Δt+tdiff) when the decision edge LH is in an interval between the time point of the rise start t0 and (t0+Δt+tdiff) and so as to cause the decision edge HL to be after the time point (t0+Δt+tdiff) when the decision edge LH is located after the time point (t0+Δt).

In the case where the time difference tskew is set in this way, a logical value having a level equal to that of the logical value stored in the FF 201 is stored in the FF 203 when the fall time of the decision subject signal HCMP is equal to the rise time thereof. This logical value must be selected by the selector 302. As evident from FIG. 2, in this case, a level of the delayed decision subject signal HCMP' in the time zone [6] (i.e., the H level) is stored in the FF 202 as a logical value, and a level of the delayed decision subject signal HCMP' in the time zone [6] or [7] (i.e., the H level) is stored in the FF 204 as a logical value. When both logical values stored in the FFs 202 and 204 are H level, therefore, the selection signal generation circuit 301 causes the selection signal y to become the H level.

When the decision edge LH is in the time zone [1], [3], [4], [5], [7] or [8], each of the FFs 201 and 203 has a stable level of the decision subject signal HCMP stored therein as a logical value. Therefore, the selector 302 may select either of logical values stored in the FFs 201 and 203. In this case, the logical value stored in the FF 202 is always the L level when the decision edge LH is in the time zone [1] or [3], and the logical value stored in the FF 204 is the L level when the decision edge LH is in the time zone [8]. In this way, when the decision edge LH is in the time zone [1], [3] or [8] (i.e., when at least one of the logical values stored in the FFs 202 and 204 is the L level), a stable level of the decision subject signal HCMP is stored in the FF 201 as a logical value, and consequently the selector 302 is adapted to select the logical value stored in the FF 201.

When the decision edge LH is in the time zone [4] and the L level of the rise of the delayed decision subject signal HCMP' is stored in the FF 202 as a logical value, the selector 302 selects the logical value stored in the FF 201 from the foregoing description. When the H level of the rise of the delayed decision subject signal HCMP' is stored in the FF 202 as a logical value, however, the logical value of the H level is stored in the FF 204 because of the phase relation of the decision edge HL to the decision edge LH. When both-the logical values stored in the FFs 202 and 204 are thus the H level, the selector 302 selects the logical value stored in the FF 203 from the foregoing description.

However, the logical value at this time is the H level, which is equal to the logical value stored in the FF 201, and no problems are posed at all. In the same way, when the decision edge LH is in the time zone [5], both the logical values stored in the FFs 202 and 204 become the H level sometimes. When the decision edge LH is in the time zone [7], both the logical values stored in the FFs 202 and 204 become the H level sometimes. Since the logical values stored in the FFs 201 and 203 at this time are equal, however, a problem is not especially posed even if the selector 302 selects the logical value stored in the FF 203.

A truth table of the selection signal generation circuit 301, which generates the selection signal y heretofore described, is shown in FIG. 3.

Operation timing of the embodiment shown in FIG. 1 will now be described with reference to FIG. 4.

If the decision subject signal HCMP is input at illustrated timing, it is supplied to the FFs 201 and 203 as the D input. The decision subject signal HCMP is delayed in the delay circuit 103 by the time tdly. The resultant delayed decision subject signal HCMP' is supplied to the FFs 202 and 204 as the D input.

For the decision subject signal HCMP, the decision edge EH is supplied at illustrated timing (1). As a result, the decision edge LH is output from the delay circuit 101 and supplied to the FFs 201 and 202 as the clock. The decision edge HL is output from the delay circuit 102 the time tskew after the decision edge LH and supplied to the FFs 203 and 204 as the clock. At this time, both the decision edges LH and HL are in timing behind the rise of the decision subject signal HCMP and ahead of the delayed decision subject signal HCMP'.

The H level of the decision subject signal HCMP is stored in the FF 201 as a logical value at the timing of the decision edge LH. The L level of the delayed decision subject signal HCMP' is stored in the FF 202 as a logical value at the timing of the decision edge LH. The H level of the decision subject signal HCMP is stored in the FF 203 as a logical value at the timing of the decision edge HL. The L level of the delayed decision subject signal HCMP' is stored in the FF 204 as a logical value at the timing of the decision edge HL. In this case, both the logical value "a" stored in the FF 202 and the logical value "b" stored in the FF 204 become the L level. Therefore, the selection signal generation circuit 301 generates the selection signal y of the H level (FIG. 3). As a result, the selector 302 selects the logical value of the H level stored in the FF 201. The output of the selector 302 becomes the H level.

Subsequently, the decision edge EH is supplied at timing (2). It is supposed that thereby the decision edge LH is output from the delay circuit 101 in an interval that is the H level interval of the decision subject signal HCMP and the H level of the delayed decision subject signal HCMP' and the decision edge HL is output from the delay circuit 102 in an interval that is the L level interval of the decision subject signal HCMP and the H level interval of the delayed decision subject signal HCMP'. The H level of the decision subject signal HCMP is stored in the FF 201 as a logical value at the timing of the decision edge LH. The H level of the delayed decision subject signal HCMP' is stored in the FF 202 as a logical value at the timing of the decision edge LH. The L level of the decision subject signal HCMP is stored in the FF 203 as a logical value at the timing of the decision edge HL. The H level of the delayed decision subject signal HCMP' is stored in the FF 204 as a logical value at the timing of the decision edge HL. In this case, both the logical value "a" stored in the FF 202 and the logical value "b" stored in the FF 204 become the H level. Therefore, the selection signal generation circuit 301 generates the selection signal y of the L level (FIG. 3). As a result, the selector 302 selects the logical value of the L level stored in the FF 203. The output of the selector 302 becomes the L level.

The output of the selector 302 is stored in the FF 611. Therefore, the logical value of the FF 611 becomes a two-valued signal that becomes the H level when the output of the selector 302 is the H level at the timing of the decision edge EH whereas that becomes the L level when the output of the selector 302 is the L level at the timing of the decision edge EH and that is synchronized in the rise and fall timing with the decision edge EH.

As heretofore described, logical values are simultaneously stored at decision edges deskewed according to the transition direction (rise or fall) of a logical value of the decision subject signal HCMP, and the transition direction of the decision subject signal HCMP is judged and selected on the basis of the logical value that is the delay time tdly ahead. A true logical value of the decision subject signal HCMP is thus determined. Therefore, the accuracy at the time when storing a logical value in the logical value storage circuit 1 can be improved.

In the description of the first embodiment, the storage processing section of the decision subject signal HCMP has been described. Although not illustrated, however, a section for processing the two-valued signal LCMP supplied from the analog comparator 2b of FIG. 9 as a decision subject signal is also included in the embodiment. It is a matter of course that logical value storage processing of the decision subject signal LCMP in that section is also conducted in the same way as the decision subject signal HCMP.

Figure 5:
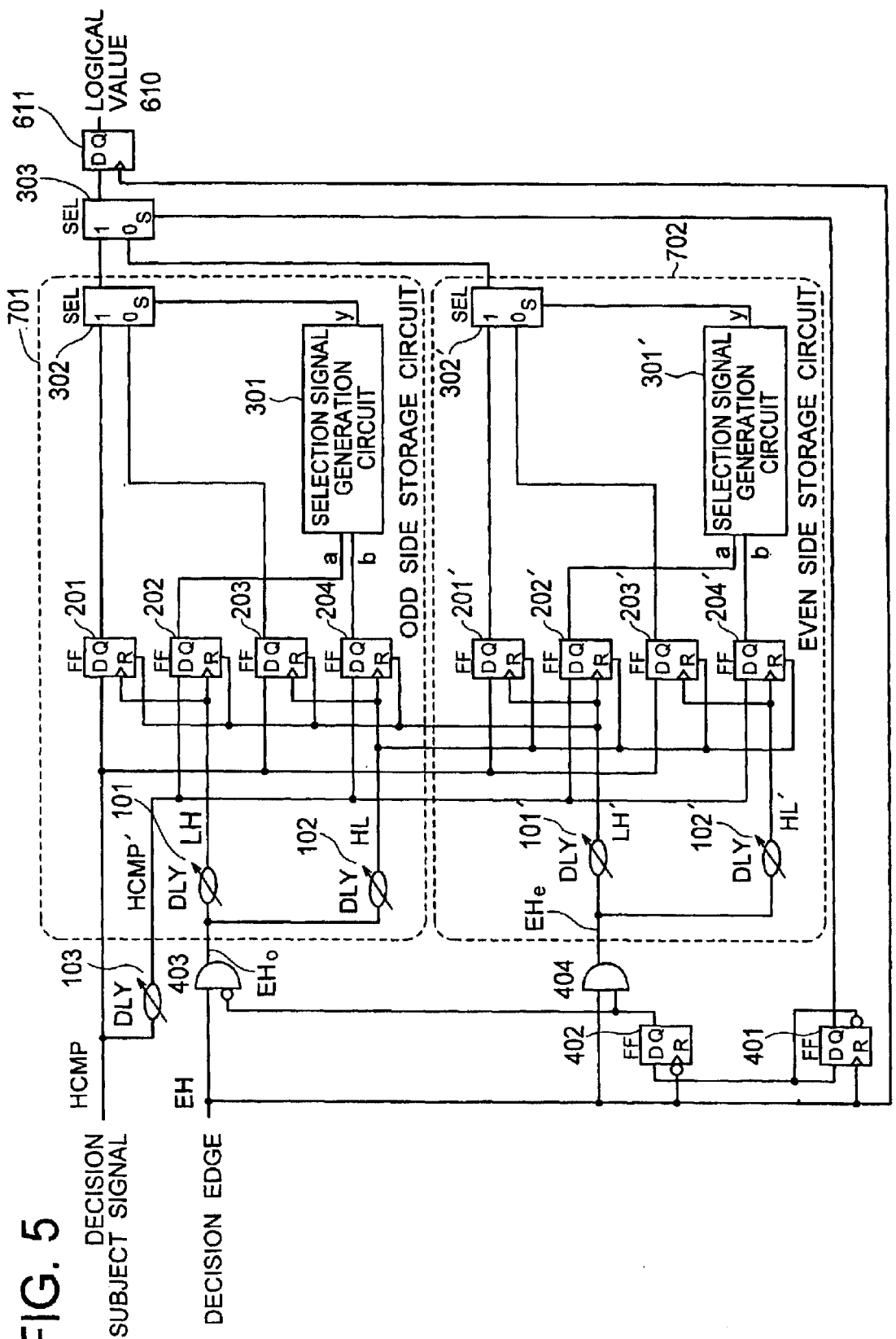
FIG. 5 is a block diagram showing a logical value storage circuit in a second embodiment of a test apparatus according to the present invention.

FIG. 5 is a block diagram showing a second embodiment of a logical value storage circuit in a test apparatus according to the present invention. The configuration shown in FIG. 1 is used in a part of FIG. 5. Reference numerals 101' and 102' denote delay circuits, 201' to 204' D-type FFs, 301' a selection signal generation circuit, 302' and 303 selectors, 401 and 402 D-type FFs, 403 and 404 AND gates, 701 an odd side storage circuit, and 702 an even side storage circuit. Components corresponding to those of FIG. 1 are denoted by like characters, and duplicated description will be omitted.

Figure 13A:
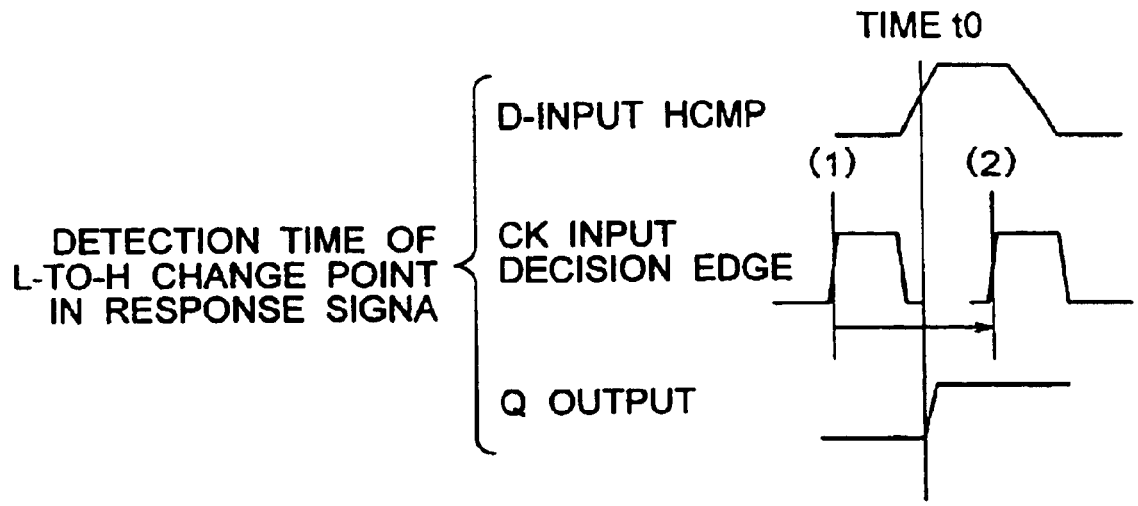
FIGS. 13A and 13B are diagrams showing a second problem of the conventional art example shown in FIG. 9.
Figure 13B:
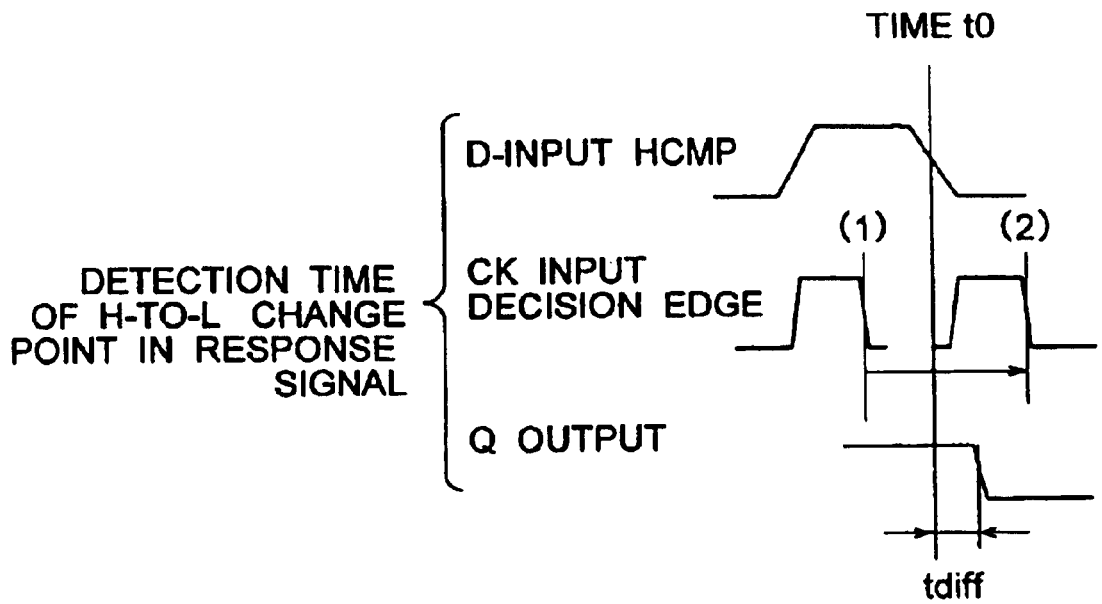

In the test apparatus having the configuration shown in FIG. 9, the second embodiment has a configuration that dissolves not only the first problem (rise and fall time difference) but also the second problem (set up time difference of FF) described with reference to FIG. 13.

With reference to FIG. 5, the second embodiment includes an odd side storage circuit 701 and an even side storage circuit 702, which have the same configuration. The odd side storage circuit 701 is supplied with every other decision edge EH (hereafter referred to as odd decision edge EHo) from the AND gate 403. The even side storage circuit 702 is supplied with every other decision edge EH different from the every other decision edge EH supplied to the odd side storage circuit 701 (hereafter referred to as even decision edge EHe), from the AND gate 404. A configuration section including the odd side storage circuit 701 and the delay circuit 103 has the same configuration as the configuration section shown in FIG. 1. (The odd decision edge EHo corresponds to the decision edge EH shown in FIG. 1) The odd decision edge EHo dissolves the first problem caused when storing the logical value of the decision subject signal HCMP. In the same way, a configuration section including the even side storage circuit 702 and the delay circuit 103 has the same configuration as the configuration section shown in FIG. 1. (The even decision edge EHe corresponds to the decision edge EH shown in FIG. 1) The even decision edge EHe dissolves the first problem caused when storing the logical value of the decision subject signal HCMP.

The delay circuits 101 and 101' have equal delay values. Furthermore, the delay circuits 102 and 102' also have equal delay values. Therefore, the odd side storage circuit 701 and the even side storage circuit 702 conduct the same operation alternately every other supply of the decision edge EH. If the odd side storage circuit 701 operates and a resultant logical value is obtained in the selector 302, then the selector 303 selects and supplies it to the FF 611. If the even side storage circuit 702 operates and a resultant logical value is obtained in the selector 302', then the selector 303 selects and supplies it to the FF 611.

Operation conducted in the odd side storage circuit 701 and the even side storage circuit 702 in order to dissolve the first problem is the same as that described with reference to FIGS. 1 to 4. Therefore, detailed description thereof will be omitted.

The FFs 401 and 402 and the AND gates 403 and 404 function to separate input decision edges EH into odd decision edges EHo and even decision edges EHe.

This operation will be described with reference to FIG. 6. In the FF 401, its inverted output becomes its D input. Whenever the decision edge EH is input, the inverted output of the FF 401 is inverted in level. The inverted output of the FF 401 becomes a D input of the FF 402. The decision edge EH is inverted in level and a resultant edge is supplied to the FF 402 as its clock. Therefore, an uninverted output Q of the FF 402 is inverted in level every trail edge (falling edge) of the decision edge EH. The uninverted output Q of the FF 402 is inverted in level, and then supplied to the AND gate 403 as a gate signal. As a result, the odd decision edge EHo is extracted. Furthermore, the uninverted output Q of the FF 402 is supplied to the AND gate 404 as a gate signal. As a result, the edge decision edge EHe is extracted.

Each of the FFs 201 to 204 in the odd side storage circuit 701 has a reset terminal R, and is reset by a decision edge LH', which is generated by the delay circuit 101' in the even side storage circuit 702. In the same way, each of the FFs 201' to 204' in the even side storage circuit 702 also has a reset terminal R, and is reset by a decision edge HL, which is generated by the delay circuit 102 in the odd side storage circuit 701. In other words, when storing logical values of the decision subject signal HCMP in the odd side storage circuit 701, all of the FFs 201' to 204' in the even side storage circuit 702 are reset. When storing logical values of the decision subject signal HCMP in the even side storage circuit 702, all of the FFs 201 to 204 in the odd side storage circuit 701 are reset.

When storing the logical values of the decision subject signal HCMP and the delayed decision subject signal HCMP' at timing of the decision edges LH, HL, LH' and HL', therefore, all logical values stored in the FFs 201 to 204 and 201' to 204' until then become the L level. When the logical value to be stored is the H level, therefore, the stored logical value changes from the L level to the H level. When the logical value to be stored is the L level, therefore, the stored logical value is kept at the L level as it is. In the outputs Q of the FFs 201 to 204 and 201' to 204', a change from the H level to the L level, i.e., a fall does not occur. (By the way, when the FFs 201 to 204 or 201' to 204' are reset, the output Q changes from the H level to the L level in some cases. However, this is not caused by storing a logical value of the decision subject signal HCMP or the delayed decision subject signal HCMP'.)

In this way, the logical values of the decision subject signal HCMP and the delayed decision subject signal HCMP' can be stored in the FFs 201 to 204 and 201' to 204' so as not cause a fall.

The reset method of the FFs 201 to 204 and 201' to 204' is not limited to the method. Each FF needs only be in the reset state when storing a logical value newly. Therefore, a reset signal for that purpose may be created separately.

Operation of the embodiment will now be described with reference to FIG. 6. In order to prevent the description from becoming complicated, however, the decision edges LH and HL are illustrated so as to be nearly equal in timing, and the decision edges LH' and HL' are illustrated so as to be nearly equal in timing.

Figure 6:
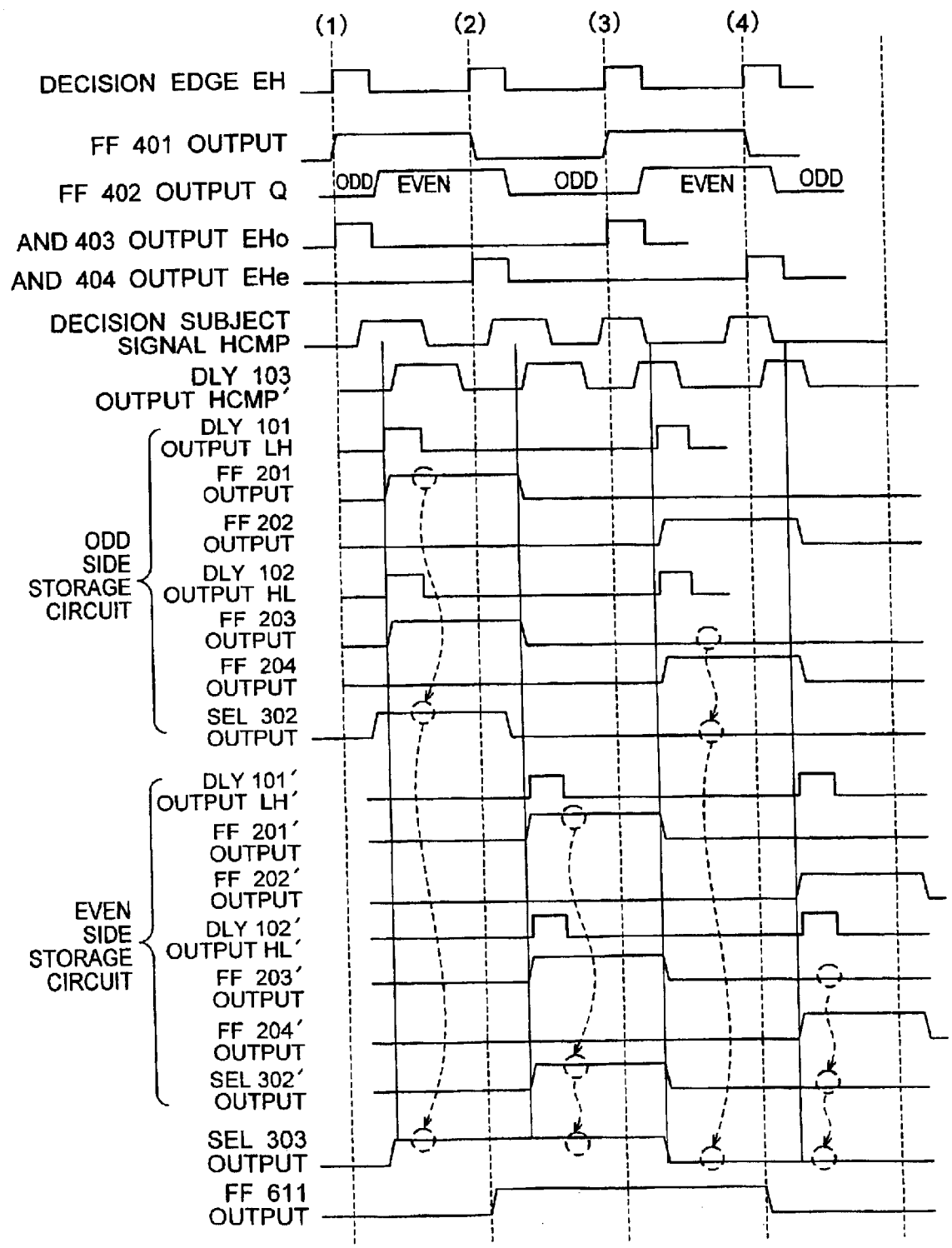
FIG. 6 is a timing chart showing signals in various locations in FIG. 5.

With reference to FIGS. 5 and 6, it is supposed that the decision subject signal HCMP and the delayed decision subject signal HCMP' are supplied to the odd side storage circuit 701 and the even side storage circuit 702 at illustrated timing.

It is supposed that in such a state the decision edge EH is supplied at timing (1). The odd decision edge EHo is obtained from the decision edge EH by the AND gate 403. The decision edges LH and HL are generated in the odd side storage circuit 701 from the odd decision edge EHo. If the decision edges LH and HL are in the H level interval of the decision subject signal HCMP and in the L level interval of the delayed decision subject signal HCMP', then the FFs 201 to 204 have already been reset, and consequently the logical value of the H level of the decision subject signal HCMP is stored in the FF 201. As a result, the output of the FF 201 rises from the L level to the H level. Since the logical value of the L level of the delayed decision subject signal HCMP' is stored in the FF 202, the output of the FF 202 is kept at the L level as it is (i.e., the output of the FF 202 is not inverted from the H level to the L level). In the same way, the output of the FF 203 rises from the L level to the H level, and the output of the FF 204 is kept at the L level as it is.

As evident from the foregoing description, the selector 302 selects the H level output of the FF 201. Since the selector 303 is controlled by the uninverted output Q of the FF 401, the selector 303 selects the output of the selector 302 at this time and supplies it to the FF 611.

At this time, the FFs 201' to 204' in the even side storage circuit 702 are reset by the decision edge HL of the odd side storage circuit 701. Therefore, all outputs of the FFs 201' to 204' become the L level.

Subsequently, the decision edge EH is supplied at timing (2). The even decision edge EHe is obtained from the decision edge EH by the AND gate 404. The decision edges LH' and HL' are generated in the even side storage circuit 702 from the even decision edge EHe. The FFs 201' to 204' conduct the same operation as that of the FFs 201 to 204 in the odd side storage circuit 701 in response to the decision edges LH' and HL'. In addition, all of the FFs 201 to 204 in the odd side storage circuit 701 are reset by the decision edge LH'. Furthermore, at this time, the selector 303 selects the output of the selector 302' of the even side storage circuit 702 and supplies it to the FF 611.

When the decision edge EH is input at next timing of (3), storage of logical values is conducted in the odd side storage circuit 701 and the FFs 201' to 204' in the even side storage circuit 702 are reset. When the decision edge EH is input at next timing of (4), storage of logical values is conducted in the even side storage circuit 702 and the FFs 201 to 204 in the odd side storage circuit 701 are reset. Thereafter, such an operation is successively repeated.

As heretofore described, storage of the logical values is conducted always from the L level by resetting the FFs 201 to 204 and the FFs 201' to 204', which serve as the logical value storage means, before storing new logical values of the decision subject signal. Therefore, a storage value is prevented from differing according to the FF set up time difference, and the second problem is dissolved.

In the description of the second embodiment heretofore described, the processing section of the decision subject signal HCMP has been described. Although not illustrated, however, a section for processing the two-valued signal LCMP supplied from the analog comparator 2b of FIG. 9 as a decision subject signal is also included in the embodiment. It is a matter of course that logical value storage processing of the decision subject signal LCMP in that section is also conducted in the same way as the decision subject signal HCMP.

Figure 7:
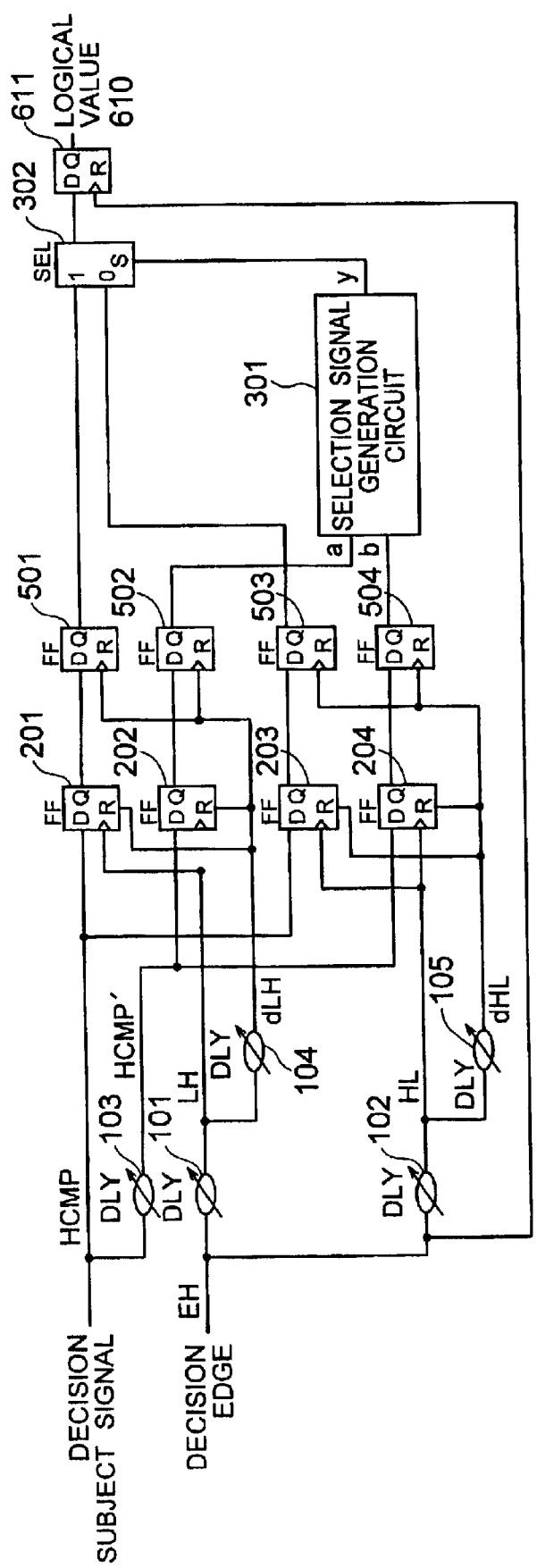
FIG. 7 is a block diagram showing a logical value storage circuit in a second embodiment of a test apparatus according to the present invention.

FIG. 7 is a block diagram showing a third embodiment of a logical value storage circuit in a test apparatus according to the present invention. Reference numerals 104 and 105 denote delay circuits, and 501 to 504 D-type FFs. Components corresponding to those of FIG. 1 are denoted by like character The third embodiment also dissolves the first and second problems in the test apparatus having the configuration shown in FIG. 9.

In FIG. 9, a decision edge LH supplied from a delay circuit 101 is supplied to FFs 201 and 202 as a clock. In addition, the decision edge LH is delayed by the delay circuit 104, resulting in a delayed decision edge dLH. The delayed decision edge dLH is supplied to reset terminals R of the FFs 201 and 202 as a reset pulse. In the same way, a decision edge HL supplied from a delay circuit 102 is supplied to FFs 203 and 204 as a clock. In addition, the decision edge HL is delayed by the delay circuit 105, resulting in a delayed decision edge dHL. The delayed decision edge dHL is supplied to reset terminals R of the FFs 203 and 204 as a reset pulse. Furthermore, outputs of the FFs 201 and 202 are supplied respectively to the FFs 501 and 502 as D inputs. Those logical values are stored in the FFs 501 and 502 by using the delayed decision edge dLH supplied from the delay circuit 104 as a clock. In the same way, outputs of the FFs 203 and 204 are supplied respectively to the FFs 503 and 504 as D inputs. Those logical values are stored in the FFs 503 and 504 by using the delayed decision edge dHL supplied from the delay circuit 105 as a clock.

A selection signal generation circuit 301 generates a selection signal y on the basis of outputs "a" and "b" respectively of the FFs 502 and 504 according to the truth table shown in FIG. 4. A selector 302 selects one of outputs of the FFs 501 and 503 according to the level of the selection signal y, and supplies it to a FF 611.

A configuration and operation other than those described heretofore are the same as those of the first embodiment shown in FIG. 1. As an example, therefore, phase relations of the decision edges LH and HL are the same as those of the first embodiment.

Figure 8:
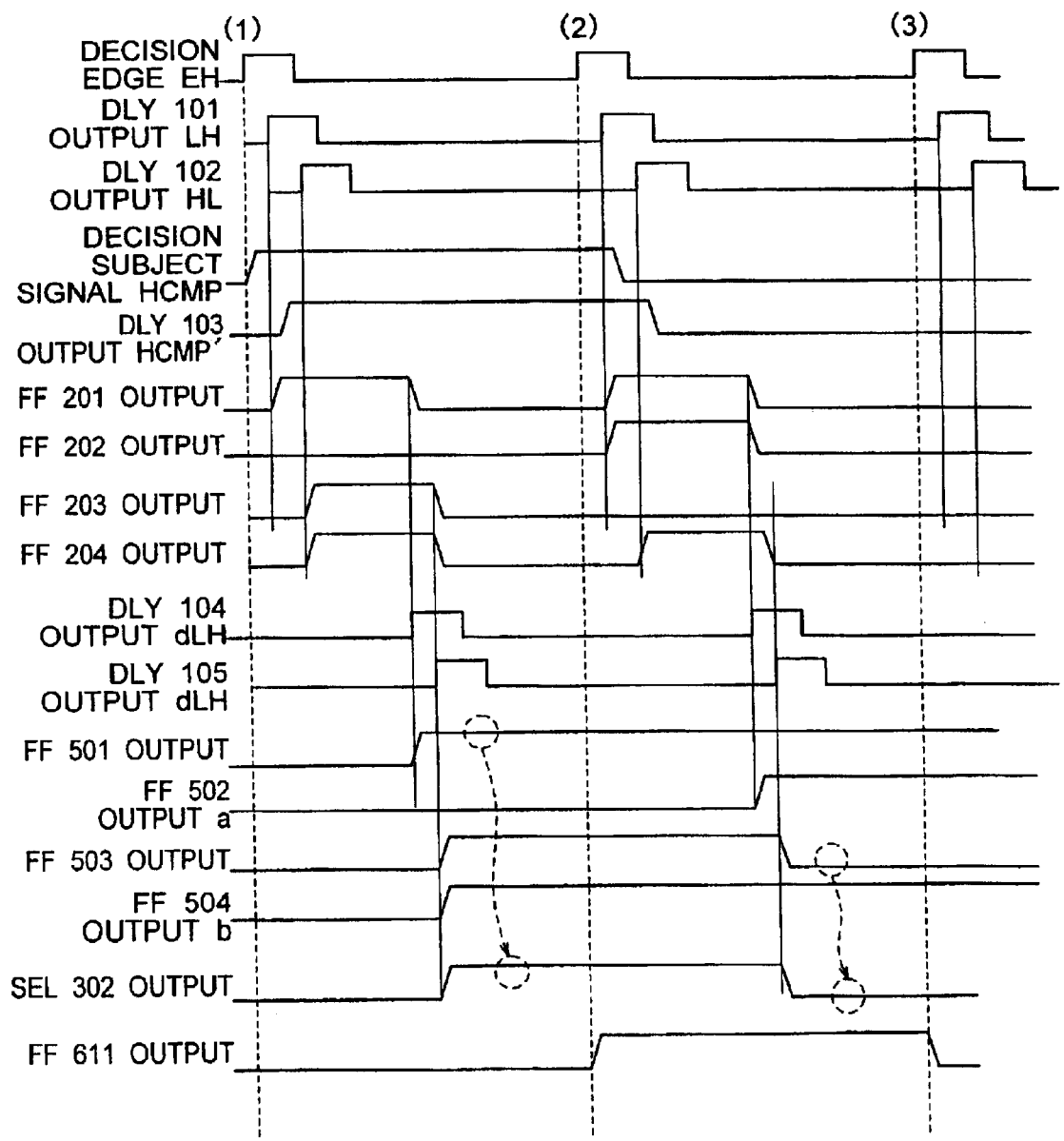
FIG. 8 is a timing chart showing signals in various locations in FIG. 7.

Operation of the third embodiment will now be described with reference to FIG. 8, which shows timing relations among signals in various locations in FIG. 7.

The decision subject signal HCMP shown in FIG. 7 is input at illustrated timing, and it is supplied to the FFs 201 and 203 as the D input. The decision subject signal HCMP is delayed in the delay circuit 103 by the delay time tdly (FIG. 2). The resultant delayed decision subject signal HCMP' is supplied to the FFs 202 and 204. It is supposed that when the decision edge EH is input in such a state at illustrated timing (1) the decision edge LH output from the delay circuit 101 is in an H level interval of the decision subject signal HCMP and an L level interval of the delayed decision subject signal HCMP' and the decision edge HL output from the delay circuit 102 is in an H level interval of the decision subject signal HCMP and an H level interval of the delayed decision subject signal HCMP'. The H level of the decision subject signal HCMP is stored in the FF 201 as a logical value. The L level of the delayed decision subject signal HCMP' is stored in the FF 202 as a logical value. The H level of the decision subject signal HCMP is stored in the FF 203 as a logical value. And the H level of the delayed decision subject signal HCMP' is stored in the FF 204 as a logical value.

The logical values are thus stored in the FFs 201 to 204. The logical values stored in the FFs 201 and 202 are stored respectively in the FFs 501 and 502 by the delayed decision edge dLH, which is obtained by providing the decision edge LH with a predetermined time delay in the delay circuit 104. Immediately thereafter, the FFs 201 and 202 are reset by the delayed decision edge dLH. In the same way, the logical values stored in the FFs 203 and 204 are transferred respectively to the FFs 501 and 502 and stored therein by the delayed decision edge dHL, which is obtained by providing the decision edge HL with a predetermined time delay in the delay circuit 105. Immediately thereafter, the FFs 203 and 204 are reset by the delayed decision edge dHL.

In this way, the logical values of the decision subject signal HCMP and the delayed decision subject signal HCMP' are stored in the FFs 201 to 204, and when time equal to the delay time of the delay circuit 104 or 105 has elapsed thereafter, those logical values are transferred to and stored in the FFs 501 to 504. When the transfer has been finished, the FFs 201 to 204 are reset. When storing logical values of the decision subject signal HCMP and the delayed decision subject signal HCMP' in the FFs 201 to 204 at decision edges LH and HL, which are generated respectively in the delay circuits 101 and 102 from the decision edge input at the next timing (in this case, timing of (2)), therefore, all of the logical values stored in the FFs 201 to 204 are L levels. If the logical value of the decision subject signal HCMP or the delayed decision subject signal HCMP' to be newly stored is the H level, therefore, the logical value stored in the corresponding FF included in the FFs 201 to 204 changes from the L level to the H level. If the logical value of the decision subject signal HCMP or the delayed decision subject signal HCMP' to be newly stored is the L level, however, the logical value stored in the corresponding FF included in the FFs 201 to 204 is kept at the L level as it is.

When newly storing the logical value of the decision subject signal HCMP or the delayed decision subject signal HCMP', therefore, the logical value stored in the FFs 201 to 204 never changes from the H level to the L level (i.e., never falls). In the same way as the second embodiment, therefore, the second problem (i.e., the problem caused by FF set up time difference) can be dissolved.

Furthermore, the same logical values as those taken in the FFs 201 to 204 are stored in the FFs 501 to 504. According to the truth table as shown in FIG. 2, therefore, the selection signal generation circuit 301 generates the selection signal y on the basis of the output "a" of the FF 502, which is equal to the logical value taken in by the FF 202, and the output "b" of the FF 504, which is equal to the logical value taken in by the FF 204. In response to the selection signal y, the selector 302 operates in the same way as the selector 302 in the foregoing embodiments, and selects the output of either FF 501 or FF 503 and supplies the selected output to the FF 611. In the case of the timing (1), the output "a" of the FF 202 is the L level and the output "b" of the FF 204 is the H level as evident from FIG. 8. According to FIG. 4, therefore, the selection signal y becomes the H level, and the selector 302 selects the output of the FF 501.

It is supposed that the decision edge EH is input at timing (2) and the decision edges LH and HL are in a fall portion of the decision subject signal HCMP. It is also supposed that the logical values stored in the FFs 201, 202 and 204 rise from the L level to the H level and the logical value stored in the FF 203 is kept at the L level as it is as illustrated. These logical values are transferred to the FFs 501 to 504. The outputs of the FFs 501, 502 and 504 become the H level, and the output of the FF 502 becomes the L level. In this case, the selection signal generation circuit 302 generates a selection signal of the L level. As a result, the selector 302 selects the L level output to the FF 503.

Thus, in the third embodiment as well, when the decision edge LH is in the fall of the decision subject signal HCMP, there is selected the output of the FF 503, which stores the level of the decision subject signal HCMP obtained at timing delayed by the time difference tskew between the decision edges LH and HL. Therefore, an accurate logical value of the decision subject signal HCMP can be obtained without being affected by a difference in characteristic between the rise and the fall. In other words, in the third embodiment as well, the first problem can be dissolved.

In the description of the third embodiment heretofore described, the processing section of the decision subject signal HCMP has been described. Although not illustrated, however, a section for processing the two-valued signal LCMP supplied from the analog comparator 2b of FIG. 9 as a decision subject signal is also included in the embodiment. It is a matter of course that logical value storage processing of the decision subject signal LCMP in that section is also conducted in the same way as the decision subject signal HCMP.

As heretofore described, according to the present invention, a variation of the stored logical values caused by a time difference of logical value storage of a decision subject signal, which is in turn caused by a level transition time difference between the rise and fall of the decision subject signal, and a data set up time difference of the logic value storage means for the decision edges can be reduced in order to implement a high accuracy logical value storage circuit. It is this possible to accurately extract and store the logical values of the decision subject signal. The accuracy of the test apparatus can be further improved.

It should be further understood by those skilled in the art that the foregoing description has been made on embodiments of the invention and that various changes and modifications may be made in the invention without departing from the spirit of the invention and the scope of the appended claims.

What is claimed is:

1. A testing method of a semiconductor apparatus using a test apparatus comprising, a comparator for comparing a response signal supplied from a device to be tested in response to a test waveform with a predetermined threshold and outputting a two-valued decision subject signal depending on a level of the response signal;

timing generation means for generating a decision edge at predetermined timing for the decision subject signal;

logical value storage means for extracting and storing logical values of the decision subject signal based on the decision edge; and comparison means for comparing an output of said logical value storage means with an expected value and determining whether the device to be tested should fail or pass, comprising the steps of:

in a first delay means of said logical value storage means, delaying the decision edge generated by said timing generation means by a predetermined time and generating a first decision edge;

in a second delay means of said logical value storage means, delaying the decision edge generated by said timing generation means by a predetermined time and generating a second decision edge, the second decision edge being adjusted in timing with respect to the first decision edge according to a fall time of the decision subject signal;

in a first storage means of said logical value storage means, storing a logical value of the decision subject signal obtained at timing of the first decision edge;

in a second storage means of said logical value storage means, storing a logical value of the decision subject signal obtained at timing of the second decision edge;

in a selection means of said logical value storage means, selecting either the logical value stored in the first storage means or the logical value stored in the second storage means and supplying the selected logical value to said comparison means; and selecting the logical value stored in said second storage means by said selection means, when the first decision edge is in or near a fall time of the decision subject signal.

2. The test method according to claim 1, further comprising, in said logical value storage means, the steps of:

in a third delay means, delaying the input decision subject signal by a predetermined time to generate a delayed decision subject signal;

in a third storage means, storing a logical value of the delayed decision subject signal obtained at timing of the first decision edge;

in a fourth storage means, storing a logical value of the delayed decision subject signal obtained at timing of the second decision edge; and controlling selection operation of said selection means based on a relation between the logical values stored in said third and fourth storage means.

3. A testing method of a semiconductor apparatus using a test apparatus comprising, a comparator for comparing a response signal supplied from a device to be tested in response to a test waveform with a predetermined threshold and outputting a two-valued decision subject signal depending on a level of the response signal;

timing generation means for generating a decision edge at predetermined timing for the decision subject signal;

first logical value storage means for extracting and storing logical values of the decision subject signal based on every other edge of the decision edge;

second logical value storage means for extracting and storing logical values of the decision subject signal based on every other edge of the decision edge different from that for the first logical value storage means;

first selection means for selecting the logical value stored in said first logical value storage means when the decision edge is supplied to said first logical value storage means and selecting the logical value stored in said second logical value storage means when the decision edge is supplied to said second logical value storage means; and comparison means for comparing an output of said first logical value storage means with an expected value and determining whether the device to be tested should fail or pass, comprising the steps of:

in a first delay means of each of said first and second logical value storage means, delaying the decision edge generated by said timing generation means by a predetermined time and generating a first decision edge;

in a second delay means of each of said first and second logical value storage means, delaying the decision edge generated by said timing generation means by a predetermined time and generating a second decision edge, the second decision edge being adjusted in timing with respect to the first decision edge according to a fall time of the decision subject signal;

in a first storage means of each of said first and second logical value storage means, storing a logical value of the decision subject signal obtained at timing of the first decision edge;

in a second storage means of each of said first and second logical value storage means, storing a logical value of the decision subject signal obtained at timing of the second decision edge;

in a second selection means of each of said first and second logical value storage means, selecting either the logical value stored in the first storage means or the logical value stored in the second storage means and supplying the selected logical value to said first selection means;

in a reset means of each of said first and second logical value storage means, resetting said first and second storage means at least before newly storing logical values of the decision subject signal at the first and second decision edges; and selecting the logical value stored in said second storage means by said second selection means, when the first decision edge is in or near a fall time of the decision subject signal.

4. The testing method according to claim 3, further comprising, in each of said first and second logical value storage means, the steps of:

in a third delay means, delaying the input decision subject signal by a predetermined time to generate a delayed decision subject signal;

in a third storage means, storing a logical value of the delayed decision subject signal obtained at timing of the first decision edge;

in a fourth storage means, for storing a logical value of the delayed decision subject signal obtained at timing of the second decision edge;

controlling selection operation of said second selection means based on a relation between the logical values stored in said third and fourth storage means; and resetting said third and fourth storage means by said reset means at least before newly storing logical values of the delayed decision subject signal at the first and second decision edges.

5. The testing method according to claim 4, comprising the steps of:

resetting said first to fourth storage means of said first logical value storage means at timing of the first decision edge in said second logical value storage means, and resetting said first to fourth storage means of said second logical value storage means at timing of the second decision edge in said first logical value storage means.

6. A testing method of a semiconductor apparatus using a test apparatus comprising, a comparator for comparing a response signal supplied from a device to be tested in response to a test waveform with a predetermined threshold and outputting a two-valued decision subject signal depending on a level of the response signal;

timing generation means for generating a decision edge at predetermined timing for the decision subject signal;

logical value storage means for extracting and storing logical values of the decision subject signal based on the decision edge; and comparison means for comparing an output of said logical value storage means with an expected value and determining whether the device to be tested should fail or pass, comprising the steps of:

in a first delay means of said logical value storage means, delaying the decision edge generated by said timing generation means by a predetermined time and generating a first decision edge;

in a second delay means of said logical value storage means, delaying the decision edge generated by said timing generation means by a predetermined time and generating a second decision edge, the second decision edge being adjusted in timing with respect to the first decision edge according to a fall time of the decision subject signal;

in a first storage means of said logical value storage means, storing a logical value of the decision subject signal obtained at timing of the first decision edge;

in a second storage means of said logical value storage means, storing a logical value of the decision subject signal obtained at timing of the second decision edge;

in a selection means of said logical value storage means, selecting either the logical value stored in the first storage means or the logical value stored in the second storage means and supplying the selected logical value to said comparison means;

transferring the logical value stored in said first storage means to a third storage means of said logical value means;

transferring the logical value stored in said second storage means to a fourth storage means of said logical value storage means;

selecting either the logical value stored in said third storage means or the logical value stored in said fourth storage means, and supplying the selected logical value to said comparison means;

resetting said first and second storage means after the logical values have been transferred therefrom to said third and fourth storage means; and selecting the logical value stored in said fourth storage means, when the first decision edges is in or near a fall time of the decision subject signal.

7. The testing method according to claim 6, further comprising, in said logical value storage means, the steps of:

in a third delay means, delaying the input decision subject signal by a predetermined time to generate a delayed decision subject signal;

in a fifth storage means, storing a logical value of the delayed decision subject signal obtained at timing of the first decision edge;

in a sixth storage means, storing a logical value of the delayed decision subject signal obtained at timing of the second decision edge;

transferring the logical value stored in said fifth storage means to a seventh storage means;

transferring the logical value stored in said sixth storage means to a eight storage means;

controlling selection operation of said selection means based on a relation between the logical values stored in said seventh and eighth storage means; and resetting said fifth and sixth storage means by said reset means after the logical values stored therein have been transferred to said seventh and eighth storage means.

* * * * *

UNITED STATES PATENT AND TRADEMARK OFFICE
CERTIFICATE OF CORRECTION

PATENT NO. : 6,768,953 B2 Page 1 of 1
DATED : July 27, 2004
INVENTOR(S) : Fujio Oonishi et al.

It is certified that error appears in the above-identified patent and that said Letters Patent is hereby corrected as shown below:

Title page,
Item [30], Foreign Application Priority Data, delete "Jun. 28, 2001" and insert therefor -- May 31, 2001 --.

Signed and Sealed this

Eighth Day of February, 2005

JON W. DUDAS
*Director of the United States Patent and Trademark Office*